(12) United States Patent
Biernacki

(10) Patent No.: US 6,759,913 B2
(45) Date of Patent: Jul. 6, 2004

(54) CRYSTAL RESONATOR BASED OSCILLATOR FORMED BY ATTACHING TWO SEPARATE HOUSINGS

(75) Inventor: John Biernacki, Glendale Heights, IL (US)

(73) Assignee: CTS Corporation, Elkhart, IN (US)

(*) Notice: Subject to any disclaimer, the term of this patent is extended or adjusted under 35 U.S.C. 154(b) by 0 days.

(21) Appl. No.: 09/896,182

(22) Filed: Jun. 29, 2001

(65) Prior Publication Data

US 2003/0001682 A1 Jan. 2, 2003

(51) Int. Cl.[7] .................................................. H03B 1/00
(52) U.S. Cl. ........................ 331/68; 331/158; 331/116 R; 310/318; 361/730; 361/753; 361/820
(58) Field of Search ........................ 331/158, 68, 116 R, 331/66; 310/318; 361/730, 753, 820

(56) References Cited

U.S. PATENT DOCUMENTS

| 4,609,883 | A | 9/1986 | Mizumura et al. ............ 331/96 |
| 5,381,039 | A | 1/1995 | Morrison |
| 5,438,219 | A | 8/1995 | Kotzan et al. ............... 257/469 |
| 5,500,628 | A | 3/1996 | Knecht ......................... 331/68 |
| 6,229,249 | B1 | 5/2001 | Hatanaka et al. ............ 310/348 |
| 6,229,404 | B1 | 5/2001 | Hatanaka ..................... 331/68 |
| 6,239,669 | B1 | 5/2001 | Koriyama et al. ............. 333/26 |

FOREIGN PATENT DOCUMENTS

| JP | 5435870 | 3/1979 |
| JP | 56043814 | 4/1981 |
| JP | 5-55612 | 7/1983 |
| JP | 5991719 | 5/1984 |
| JP | 1-100959 | 4/1989 |
| JP | 60-74659 | 4/1989 |
| JP | 6140871 | 5/1994 |
| JP | 2000 299611 A | 2/2000 |

*Primary Examiner*—Arnold Kinkead
(74) *Attorney, Agent, or Firm*—Talivaldis Cepuritis; Joseph M. Kuo; Steven Weseman

(57) ABSTRACT

A double-sided oscillator package having an open-top oscillator housing adapted to receive electronic components and a hermetically sealed resonator housing containing a piezoelectric element is described. The electronic components and piezoelectric element are electrically connected. The respective housing can be manufactured separately and the components thereof assembled thereafter to form the package.

16 Claims, 5 Drawing Sheets

CRYSTAL RESONATOR BASED OSCILLATOR FORMED BY ATTACHING TWO SEPARATE HOUSINGS

FIELD OF INVENTION

The present invention relates generally to frequency control devices and, in particular, to a surface mounted crystal resonator based oscillator assembly contained in two separate but joined housings.

DESCRIPTION OF THE RELATED ART

Frequency control devices are an essential component for many types of mobile communication equipment such as portable telephones, pagers, wireless modems, and personal digital assistants (PDA). To produce a base frequency of oscillation, an electronic oscillator circuit is employed that will typically include a piezoelectric device. Piezoelectric devices can be designed to mechanically resonate at very precise and repeatable frequencies, and this mechanical resonance is translated by the device to an electrical signal. Electrodes are formed upon the surface of the piezoelectric device which enable the application or pick-up of an electric field across some part of the piezoelectric device. In response to electrical stimulation, the piezoelectric device will change physical shape, and when the electrical signal is at the mechanical resonant frequency of the piezoelectric device, energy lost through the piezoelectric device is at a minimum.

Electronic oscillator circuits are typically associated with these piezoelectric devices that set up a basic oscillation, and the piezoelectric device is then used to predicably control the frequency at which the oscillator circuit will be resonant. The mechanical properties of the piezoelectric device are obviously important to the proper functioning of the oscillator, and to accurate frequency control.

Many factors can substantially effect the mechanical properties of a piezoelectric device such as the shape of the piezoelectric material used to make the device, environmental factors including temperature, humidity, and mechanical shock, as well as contamination of the piezoelectric material by minute particles that may contact the surface of the piezoelectric device.

In order to avoid these problems, high quality resonators are generally manufactured in very clean environments such as clean rooms, and are most preferably packaged into a sealed container free of any possible contaminants of corrosive compounds. With regard to the attempts to minimize the effects of temperature, one approach has been to include electrical components or trimming components that compensate for known variations in the frequency of oscillation of the piezoelectric device through a certain temperature range. Crystal oscillators that include such electrical components are referred to as temperature compensated crystal oscillators (TCXO), and are the subject of the present invention.

An example of a TCXO package manufactured for portable wireless applications is shown in U.S. Pat. No. 5,949,294. The TCXO package shown in U.S. Pat. No. 5,949,294 consists of a bottom compartment with a cavity facing upwards, and a top compartment (the crystal resonator assembly), also with a cavity facing upwards. The top compartment is attached to the bottom compartment by metallic connections on the top surface of the bottom compartment and the bottom surface of the top compartment respectively. The top compartment cavity is sealed by a shield plate, and the bottom compartment cavity is sealed by the top compartment.

There are a number of disadvantages with such a stacked TCXO package design. If the cavity of the lower compartment is not potted, the cavity can trap liquids, such as condensed humidity, in the space between the bottom of the cavity and the bottom surface of the top compartment. Another problem with the prior art design is that the size of the TCXO package cannot be minimized substantially without encountering problems. For example, in order to reduce the overall height of the assembled package, attempts have been made to reduce the height of the components placed in the lower compartment, and also by reducing the layer thickness of the sheets that form the bottom compartment. This has resulted in decreased mechanical strength, diminished light blocking, and reduced numbers of possible interconnections between the top and bottom compartments. Another problem with such an arrangement is a lack of design flexibility. Specifically, in this configuration, the crystal resonator assembly must be of sufficient size to seal the bottom compartment.

An alternative design for a TXCO package is shown in U.S. Pat. No. 5,438,219 commonly owned by the present assignee. U.S. Pat. No. 5,438,219 shows a one piece double sided TXCO package having an open top receptacle adapted to receive electronic components and an open bottom receptacle adapted to receive a piezoelectric element and a cover for hermetically sealing the open bottom receptacle. The electronic components and piezoelectric element are electrically connected. A hermetic environment is established by coupling the cover and open bottom receptacle. When viewed in cross section the TXCO package resembles a one piece H-shaped housing.

While the TXCO package of U.S. Pat. No. 5,438,219 alleviates many of the problems with the package described in U.S. Pat. No. 5,949,294, the one piece H-shaped housing creates other problems. Many of these problems comes from the difficulties in manufacturing the one piece H-shaped housing. For example, manufacturing a one piece H-shaped housing involves flipping over the ceramic package that typically makes up the housing. This flipping requires special tooling and necessitates extra handling that could lead to contamination of the piezoelectric element. The flipping also means that one must compensate for sag in the middle of the package cavity similar to the sag in a hammock strung between two posts. Another problem with the one piece H-shaped housing is that there is very little flexibility in creating different size TXCO's for different applications because the entire housing must be constructed in a single process as opposed to changing just the resonator housing or the oscillator housing. Yet another shortcoming of the one-piece double sided housing design is that if mistakes in assembly are made, entire fabrications must be disposed of.

SUMMARY OF THE INVENTION

The present invention provides a packaged resonator and oscillator assembly suitable for use as a double-sided temperature compensated TXCO package. The resonator and the oscillator are in separate but joined housings, and are in electrical communication with one another.

The resonator housing comprises a base having a first or an internal surface, a second or external surface, and sidewalls adjacent to the base of the resonator housing that extend upwardly away from the resonator base. Preferably the sidewalls extend upwardly away from the resonator base in a substantially perpendicular manner. The resonator base and sidewalls form a resonator cavity, which is adapted to receive at least one piezoelectric component, and a cover that is coupled with the resonator sidewalls to form a hermetic enclosure.

The separately manufactured oscillator housing comprises, a base having first and second surfaces, and sidewalls adjacent to the oscillator base extending upwardly away from the oscillator base, preferably in a substantially perpendicular manner. The oscillator base and sidewalls form an oscillator cavity. This oscillator cavity is adapted to receive at least one electronic component, such as a flip chip integrated circuit.

The resonator housing and the oscillator housing are preferably manufactured separately. After the resonator housing and oscillation housing are completed, the external surfaces of the respective bases, i.e., the second surface of the resonator housing base and the second surface of the oscillator housing base, are then joined together such that the piezoelectric component in the resonator housing and the electronic component in the oscillator housing are electrically connected. The electric connection between the resonator housing and the oscillator housing may be accomplished by electrical contacts or lands formed on the external surface of the resonator housing base and the external surface of the oscillator housing base. These electronic contacts may be connected by bonding pads, which may typically be connected by solder, conductive adhesive, ultrasonic or thermosonic welds, a solder ball, or the like. These electrical contacts may alternatively be connected directly by solder, solder ball, conductive adhesive, welding, or the like. Conductive vias extending through the oscillator housing base connect the electronic component in the oscillator housing to the electrical contacts or lands on the oscillator external surface. Conductive vias extending through the resonator housing base also connect the piezoelectric component in the resonator housing with the electrical contacts or lands on the resonator external surface.

When completed, the present invention forms a substantially H-shaped TXCO package in cross-section, depending upon the individual dimensions of the respective housings. This TXCO package avoids the problems of the stacked TXCO discussed above in connection with U.S. Pat. No. 5,949,294. The two piece construction also avoid the manufacturing problems encountered with a one piece H-shaped housing.

The package embodying the present invention permits the resonator housing and the oscillator housing to be fabricated separately, and even in separate locations at different times. Because the resonator housing and the oscillator housing can be manufactured separately, conventional manufacturing equipment may be utilized at a substantial cost saving over specialized manufacturing equipment that is required for a one piece, monolithic H-shaped housing. For example, the oscillator housing may be built using conventional array or panel manufacturing processes. Resonator or crystal units from a multiplicity of sources may also be used and attached to the oscillator section without design changes. The separate assembly also enables greater flexibility in mixing and matching different size resonator housings with different size oscillation housings depending on the particular application and available space. The additional concern about compensating for sag in the middle of the package cavity is also eliminated because both the resonator and oscillator housings can be laid flat on their respective bases during the manufacturing process. Also, there is no need for the additional step of flipping the housings over after either the resonator half or oscillator half of a one piece H-shaped housing is completed.

DESCRIPTION OF PREFERRED EMBODIMENTS

Figure 1:
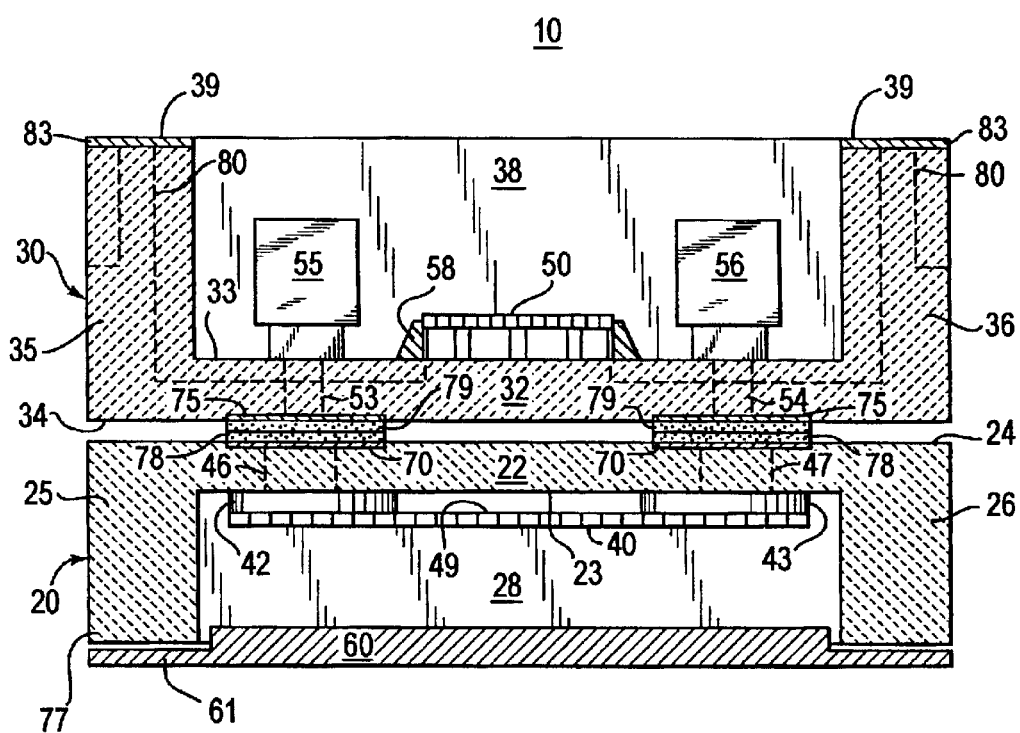
FIG. 1 is a cross sectional view of a temperature compensated crystal oscillator utilizing a preferred embodiment of the present invention.

The invention disclosed herein is susceptible to embodiment in many different forms. Shown in the drawings and described in detail hereinbelow are certain preferred embodiments of the present invention. The present disclosure is only an exemplification of the principles and features of the invention, and does not limit the invention to the illustrated embodiments. For ease of description, the crystal resonator based oscillator of this invention will be described as it is depicted in FIG. 1, and terms such as upper, lower, top, bottom, vertical, horizontal, etc. will be used with reference to that alignment.

Referring to FIG. 1, a double sided temperature compensated oscillator package 10 comprising a resonator housing 20 and an oscillator housing 30 is illustrated. This package 10 includes generally a temperature compensation circuit, having temperature-responsive components, coupled to a base 32 in the oscillator housing 30. This package 10 is also adapted to receive a piezoelectric component 40 mounted onto a portion of the package 10 in the resonator housing 20.

The resonator housing 20 comprises a base 22 having a first or internal surface 23 and a second or external surface 24. Sidewalls 25, 26 are adjacent to and surround the base 22 of the resonator housing 20, extending upwardly, i.e., away from the base 22, preferably substantially perpendicularly therefrom. The resonator base 22 and sidewalls 25, 26 form a resonator cavity 28, which is adapted to receive at least one piezoelectric component 40. A cover 60 is coupled with the resonator sidewalls 25, 26 to form a hermetic enclosure for the resonator cavity 28.

While the resonator housing 20 includes at least the piezoelectric component 40, it can also include other components, if desired. The material of construction for the piezoelectric component 40 can vary widely. Examples include quartz, AT-cut quartz strip, and the like. In a preferred embodiment, the piezoelectric component 40 comprises an AT-cut quartz strip for a well-behaved frequency versus temperature relationship from about −40° C. to about 90° C., that may be compensated for electronically. Having the piezoelectric component 40 isolated from the other components minimizes the possibility of contaminating the piezoelectric component 40, resulting in an undesirable alteration of its frequency. More particularly, isolating and physically separating the piezoelectric component 40 in the resonator housing 20 from the electronic components in the oscillator housing 30, substantially minimizes the possibility of solder, organic underfill, or other unwanted contaminants from adversely affecting the output frequency of the piezoelectric component 40, as can occur over time in prior art TCXO packages.

Figure 2:
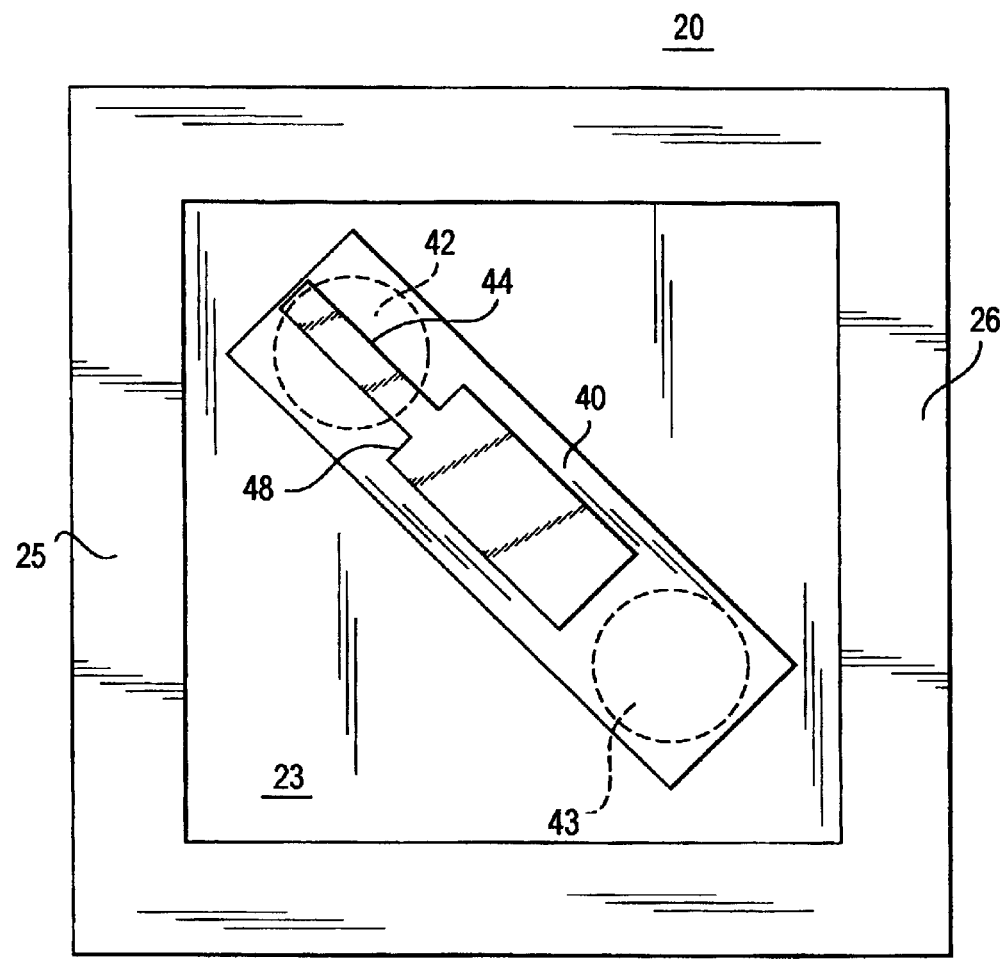
FIG. 2 is a top view of a resonator housing according to the present invention.

Referring to both FIGS. 1 and 2, the piezoelectric component 40 is positioned on and coupled to couplings 42 and 43. The couplings 42 and 43 provide mechanical and electrical connections to the piezoelectric component 40. Electrically connected to the couplings 42 and 43 are leads 46 and 47 (FIG. 1), preferably in the form of conductive tungsten filled vias, for connecting the piezoelectric component to the resonator electrical contacts 70, formed on the resonator second or external surface 24. The coupling 42 preferably includes a wraparound section 44 (FIG. 2) electrically connecting an outwardly facing electrode 48 (top electrode) of the piezoelectric component 40 with lead 46 (FIG. 1). Similarly, the coupling 43 electrically connects an inwardly facing electrode 49 (bottom electrode facing the resonator first surface 23) with lead 47 in FIG. 1. Alternatively, piezoelectric component 40 may be supported across ledges (not shown) within the resonator cavity 28, and an electrical connection may be made therebetween.

The cover 60 (FIG. 1) is complementary to resonator sidewalls 25 and 26, and is configured to be received and coupled to the resonator housing 20, and specifically to a peripheral wall portion 77. The cover 60 can be seam welded or solder sealed to the resonator sidewalls 25, 26, and preferably to the peripheral wall portion 77, to provide a hermetic seal. More particularly, the peripheral wall portion 77 and an outer periphery 61 of cover 60 are complementarily configured to provide a secure interconnection and hermetic seal of the contents in the resonator housing 20.

The oscillator housing 30 comprises an oscillator base 32 having a first or internal surface 33 and a second or external surface 34. Oscillator sidewalls 35, 36 are adjacent to and surround the oscillator base 32 and extend upwardly, i.e., away from the base, preferably substantially perpendicularly therefrom. The oscillator base 32 and oscillator sidewalls 35, 36 form an oscillator cavity 38. This oscillator cavity 38 is adapted to receive at least one electronic component, such as an integrated circuit 50. Other electronic components preferably include chip capacitors 55, 56. It is also preferred that an organic underfill 58 be included in the oscillator cavity 38.

The integrated circuit 50 can include any suitable integrated circuit, for example, a wire bonded integrated circuit including a glob top, a flip chip integrated circuit including an organic underfill or the like. In a preferred embodiment, the integrated circuit 50 is a flip chip including an organic underfill 58 for secure coupling of the integrated circuit 50 to the oscillator first or internal surface 33, and for minimizing contamination to the integrated circuit 50. Preferably, the integrated circuit 50 is attached by solder reflow onto the oscillator base first surface 33. This solder reflow preferably provides an electrical as well as mechanical connection of the integrated circuit 50 to oscillator base 32.

Figure 3:
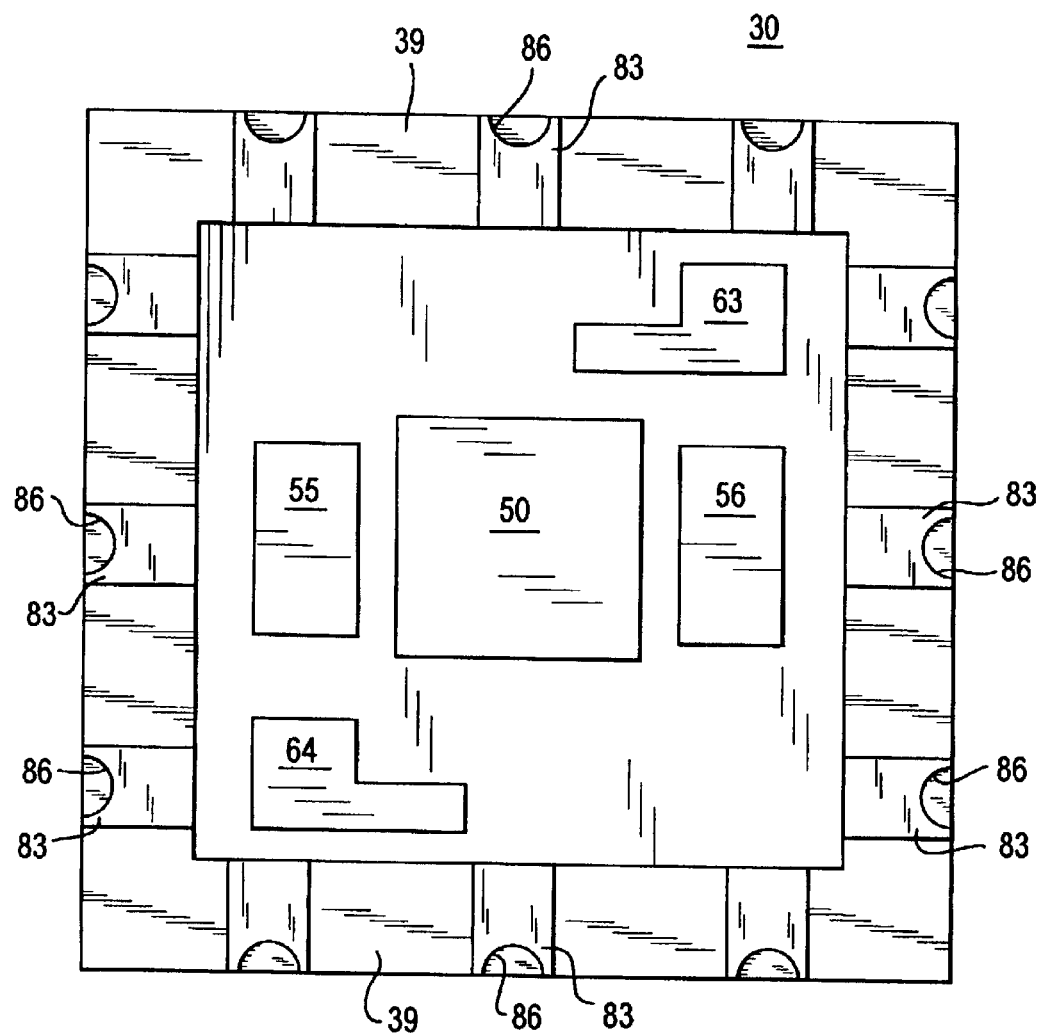
FIG. 3 is a top view of an oscillator housing according to the present invention.

Referring to both FIG. 1 and FIG. 3, the oscillator housing 30 also includes sufficient space for conductive pads 63, 64 (FIG. 3) adapted for tuning the piezoelectric component 40, and first and second chip capacitors 55, 56 which typically function as DC voltage bypass capacitors. The integrated circuit 50 itself supplies the temperature compensation function. A plurality of internal leads 80 (shown as dashed lines in FIG. 1) are included in the oscillator housing 30 for coupling the electrical components, such as the integrated circuit 50 and chip capacitors 55, 56 to one or more oscillator electrical contacts 75 formed at the oscillator second surface 35 (FIG. 1). Leads 80 are coupled to a plurality of respective contacts 83 on the oscillator housing 30, and more particularly to an upper peripheral surface 39 of the oscillator housing 30. Preferably, the upper peripheral surface 39 is substantially planar so as to provide a good contact to a circuit board (not shown) to which it will be connected. The internal leads 80 are formed in the oscillator base 32 and the oscillator sidewalls 35, 36. Thus, the plurality of conductive leads or paths 80 extend from the oscillator first surface 33 to the upper peripheral surface 39, with each lead being insulated from its adjacent lead. The leads 80 provide electrical paths from the circuitry to the upper peripheral surface 39 and contacts 83, and preferably include co-fired vias within the ceramic itself, or can include plated half holes 86 (FIG. 3), called castellations on the outside of the oscillator side walls 35, 36. Another set of internal leads 53, 54 connect the capacitors 55, 56 to electrical contacts 75.

Referring to FIG. 1, the resonator housing 20 and the oscillator housing 30 are manufactured separately. Then the second or exterior surface 24 of the resonator housing 20 and second or exterior surface 34 of the oscillator housing 30 are joined together such that the piezoelectric component 40 in the resonator housing 20 and the electronic component in the oscillator housing 30, such as integrated circuit 50, are electrically connected. The electric connection between the resonator housing 20 and the oscillator housing 30 may be accomplished via electrical contacts such as lands 70 provided at the resonator second surface 24 and electrical contacts such as lands 75 provided at the oscillator second surface 34. A set of internal leads 53, 54 connect the integrated circuit 50 and chip capacitors 55 and 56 in the oscillator housing 30 with the electrical contacts 75. Another set of internal leads 46 and 47 connect the piezoelectric component 40 and couplings 42 and 43 to the electrical contacts or lands 70.

The electronic contacts 70, 75 may be preferably connected by conductive bonding or mounting pads 78, 79. The resonator bonding pads 78 may be formed on the resonator second surface 24 and are electrically connected with the resonator electrical contacts 70. Similarly, the oscillator bonding pads 79 may be formed on the oscillator second surface 34 and are electrically connected to the oscillator electric contacts 75. The means for attaching the bonding pads may typically be formed by solder, conductive adhesive, ultrasonic or thermosonic welds, a solder ball or the like. Alternatively, the oscillator bonding pads 79 and resonator bonding pads 78 may be omitted, and the resonator electrical contacts 70 and the oscillator electrical contacts 75 may be mechanically and electrically connected directly by solder, a solder ball, conductive adhesive, or the like.

When assembled, the joined two piece temperature compensated crystal oscillator package forms a substantially H-shaped cross section as shown in FIG. 1. With the present invention, a variety of different sized resonator housings can be combined with a variety of oscillator housings. Examples of such alternative combinations are shown in FIG. 4 and FIG. 5.

Figure 4:
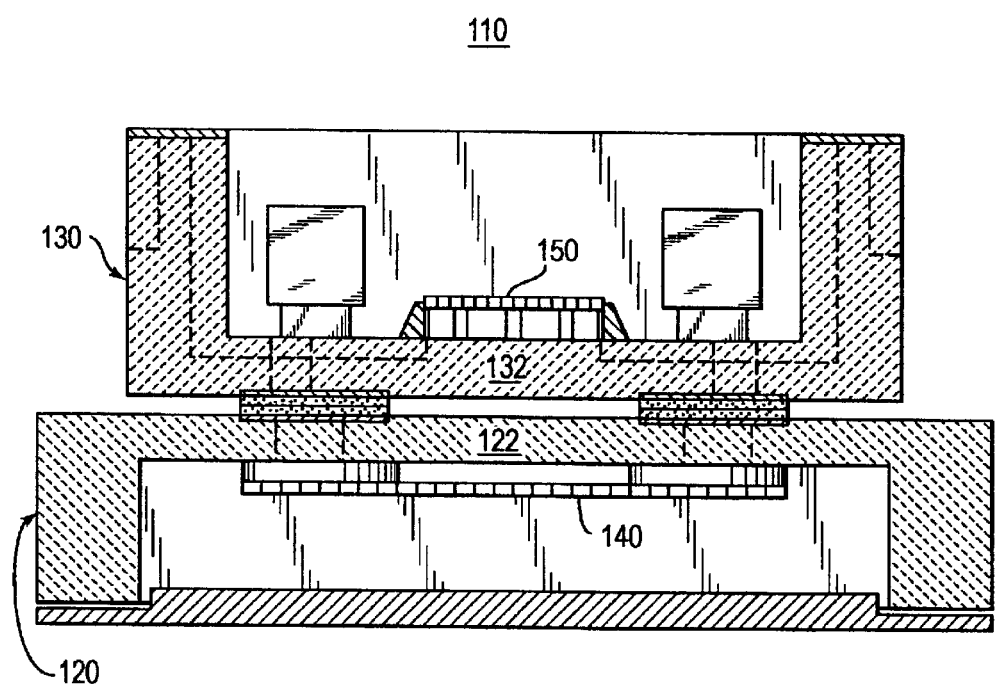
FIG. 4 is a cross sectional view of an alternative embodiment of the present invention where the resonator housing and oscillator housing are of different size.

FIG. 4 shows an alternative double sided temperature compensated oscillator package 110 comprising a resonator housing 120 and an oscillator housing 130. This package 110 includes generally a temperature compensation circuit 150, having temperature-responsive components, coupled to a base 132 in the oscillator housing 130. This package 110 is also adapted to receive a piezoelectric component 140 mounted onto a base 122 in the resonator housing 120. In this embodiment, the resonator housing 120 of package 110 is of larger width than the oscillator housing 130.

Figure 5:
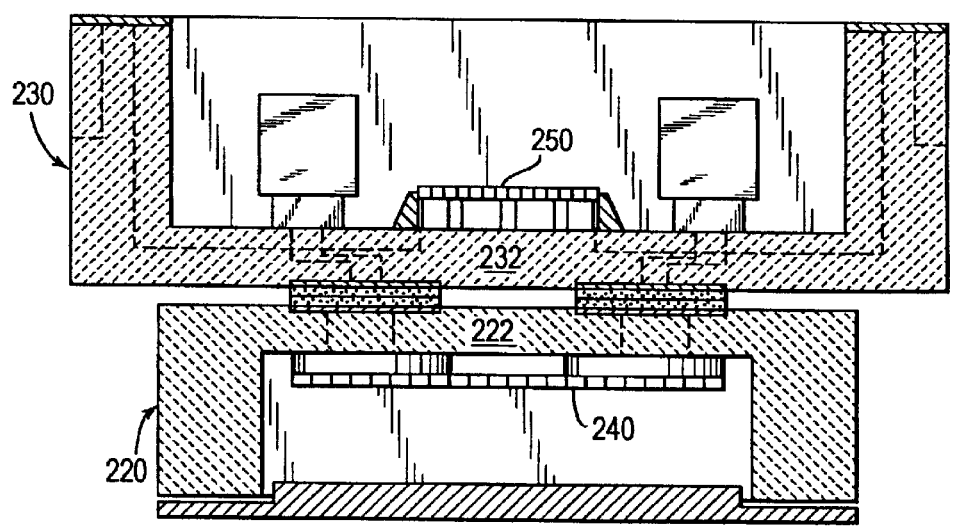
FIG. 5 is a cross sectional view illustrating yet another embodiment of the present invention where the resonator housing and oscillator housing are of different size.

FIG. 5 shows yet another alternative double sided temperature compensated oscillator package 210 comprising a resonator housing 220 and an oscillator housing 230. This package 210 also generally includes a temperature compensation circuit 250, coupled to a base 232 in the oscillator housing 230, and is adapted to receive a piezoelectric component 240 mounted onto base 222 in the resonator housing 220. In this embodiment, the resonator housing 220 of package 210 is of smaller width than the oscillator housing 230.

Although the FIGURES provided show the geometry of the package 10 to be substantially square, the exact geometries and dimensions of the housings that constitute package 10 can vary widely. Package 10 is particularly adapted for miniaturization. For example, package 10 may have dimensions of only 5 mm×7 mm×1.5 mm in one particular embodiment. As a result, package 10 is adapted for placement in an electronic device where it will typically take up a small portion of the total volume of the electronic device. The height of resonator sidewalls 25, 26 will preferably be sufficient to enclose piezoelectric component 40 and to minimize stray or unwanted capacitances between piezoelectric component 40 and associated electronic circuitry. Similarly, the height of oscillator sidewalls 35, 36 will preferably be sufficient to enclose electronic components 50, 55, 56, and also to minimize stray or unwanted contact with associated circuitry. Depending on the particular use, package 10 may be shaped geometrically differently to accommodate differing design needs. Electronic components 50, 55, and 56 can be potted if desired. In such cases oscillator cavity 38 is sized to contain a sufficient amount of a potting compound.

In a preferred embodiment, package 10 is manufactured from materials having substantially similar thermal expansion coefficients, to minimize stresses. Fired or co-fired ceramic materials such as alumina, produced for example through various casting or pressing techniques and having refractory, thick film or thin film metallizations, are suitable materials for the resonator housing 20 and oscillator housing 30. These materials are preferred, but it is known in the art that many other materials of construction exist that may also perform satisfactorily, as do many processing techniques. Alloys of nickel, iron and cobalt sold under the trademark Kovar, or Alloy 42 and the like, but preferably Kovar, because of its coefficient of thermal expansion is substantially similar to the preferred ceramic material of resonator housing 20, may be used to form cover 60.

After components are mounted and the encapsulant cured, TCXO package 10 is frequency tuned. Mass loading of piezoelectric component 40 decreases the frequency of resonance until a desired frequency is achieved. During the process of tuning, additional metal is added to the outwardly facing surface of piezoelectric component 40. Alternatively, ion milling may be performed to tune the piezoelectric component 40 by removing material. The possibility of unwanted metal contacting and adversely affecting other electronic components in resonator cavity 28 is eliminated in the preferred embodiment because these components are isolated from the other electronic components in the oscillator cavity 38. These additional components may not even be coupled to package 10 until the tuning has been completed, depending on the manufacturing sequence selected.

The method for making package 10 generally includes: (1) assembling a resonator housing 20; (2) assembling an oscillator housing 30; and (3) joining mechanically as well as electrically the resonator housing 20 with the oscillator housing 30.

Assembly of the resonator housing 20 generally includes: (1) providing an unassembled resonator housing 20; (2) providing compliant crystal couplings 42, 43 on the resonator first surface 23; (3) placing piezoelectric component 20 into resonator cavity 28; (4) frequency tuning piezoelectric component 40; and (5) hermetically sealing resonator housing 20 with cover 60. Assembly of the oscillator housing 30 generally includes: (1) providing an unassembled oscillator housing (2) stenciling solder or adhesive onto oscillator first surface 33; (3) reflowing the solder or curing the adhesive; (4) wirebonding, where necessary, any components to mating conductors on oscillator first surface 33; (5) dispensing a potting compound or encapsulant such as epoxy resin substantially over the components 50, 55, 56; and (6) curing the encapsulant. Once the package 10 has been assembled, the package 10 is tested and may be suitably coupled to a circuit board (not shown) for use in an electronic device.

The foregoing description and the drawings are illustrative of the present invention and are not to be taken as limiting. Still other variants and rearrangements of parts within the spirit and scope of the present invention are possible and will be readily apparent to those skilled in the art.

I claim:

1. A packaged resonator and oscillator assembly, which comprises:

a resonator housing having a base with first and second surfaces, upstanding sidewalls around the base of the resonator housing and together with the base forming a resonator cavity, the resonator cavity being adapted to receive at least one piezoelectric component, and a cover coupled to the resonator sidewalls and providing a hermetic enclosure for the resonator cavity;

an oscillator housing having a base with first and second surfaces, upstanding sidewalls around the base of the oscillator housing and together with the base forming an oscillator cavity, the oscillator cavity being adapted to receive at least one electronic component;

electrical contacts on the second surface of the resonator housing and on the second surface of the oscillator housing; and the resonator housing and the oscillator housing being assembled so that the at least one piezoelectric component and the at least one electronic component are electrically connected to one another through said electrical contacts, wherein the resonator housing and oscillator housing are mechanically and electrically connected to one another by conductive adhesive.

2. The packaged resonator and oscillator assembly of claim 1 further comprising a plurality of bonding pads on the second surface of the resonator housing.

3. The packaged resonator and oscillator assembly of claim 1 further comprising a plurality of bonding pads on the second surface of the oscillator housing.

4. A packaged resonator and oscillator assembly, which comprises:

a resonator housing having a base with first and second surfaces, upstanding sidewalls around the base of the resonator housing and together with the base forming a resonator cavity, the resonator cavity being adapted to receive at least one piezoelectric component, and a cover coupled to the resonator sidewalls and providing a hermetic enclosure for the resonator cavity;

an oscillator housing having a base with first and second surfaces, upstanding sidewalls around the base of the oscillator housing and together with the base forming an oscillator cavity, the oscillator cavity being adapted to receive at least one electronic component;

electrical contacts on the second surface of the resonator housing and on the second surface of the oscillator housing; and the resonator housing and the oscillator housing being assembled so that the at least one piezoelectric component and the at least one electronic component are electrically connected to one another through said electrical contacts, wherein the resonator housing and oscillator housing are mechanically and electrically connected to one another by a solder ball.

5. The packaged resonator and oscillator assembly of claim 1 further comprising a plurality of electrically conductive vias in the oscillator housing connecting the at least one electronic component with the electrical contacts on the second surface of the oscillator housing.

6. The packaged resonator and oscillator assembly of claim 1 further comprising a plurality of electrically conductive vias in the resonator housing connecting the at least one piezoelectric component with the electrical contacts on the second surface of the resonator housing.

7. The packaged resonator and oscillator assembly of claim 1 wherein the resonator housing sidewalls are unitary with the base of the resonator housing and extend substantially perpendicularly therefrom.

8. The packaged resonator and oscillator assembly of claim 1 wherein the oscillator housing sidewalls are unitary with the base of the oscillator housing and extend substantially perpendicularly therefrom.

9. The packaged resonator and oscillator assembly of claim 1 wherein the oscillator housing sidewalls define an upper peripheral surface suitable for electrical connection with a circuit board.

10. A package comprising a resonator housing and an oscillator housing:

the resonator housing having a base with first and second surfaces, resonator housing sidewall unitary with the base of the resonator housing, extending away from the base and forming an open resonator cavity therewith, the resonator cavity being adapted to receive at least one piezoelectric component at the first surface, and a cover coupled to the resonator sidewalls and defining a hermetic enclosure for the resonator cavity;

the oscillator housing having a base with first and second surfaces, oscillator housing sidewalls unitary with the base of oscillator housing and extending away from the base, and forming an open oscillator cavity therewith, the oscillator cavity being adapted to receive at least one electronic component at the first surface;

electrical contacts on the second surface of the resonator housing and on the second surface of the oscillator housing;

the second surface of the resonator housing electrically connected with the second surface of the oscillator housing by a plurality of bonding pads, and the at least one piezoelectric component in the resonator housing and the at least one electronic component in the oscillator housing being electrically connected to one another.

11. The packaged resonator and oscillator assembly of claim 10 further comprising a plurality of electrically conductive vias in the oscillator housing connecting the at least one electronic component with the electrical contacts on the second surface of the oscillator housing.

12. The packaged resonator and oscillator assembly of claim 10 further comprising a plurality of electrically conductive vias in the resonator housing connecting the at least one piezoelectric component with the electrical contacts on the second surface of the resonator housing.

13. The packaged resonator and oscillator assembly of claim 10 wherein the resonator housing sidewalls extend substantially perpendicularly from the resonator base.

14. The packaged resonator and oscillator assembly of claim 10 wherein the oscillator housing sidewalls extend substantially perpendicularly from the oscillator base.

15. The packaged resonator and oscillator assembly of claim 10 wherein the oscillator housing sidewalls define an upper peripheral surface suitable for electrical connection with a circuit board.

16. A double sided package comprising a ceramic resonator housing and a ceramic oscillator housing:

the resonator housing having a base with first and second surfaces, resonator housing unitary with the base of the resonator housing, extending substantially perpendicularly therefrom, and forming a open resonator cavity therewith, the resonator cavity being adapted to receive at least one piezoelectric at the resonator first surface, a plurality of electrical contacts formed at the resonator housing second surface, a plurality of electrically conductive vias in the resonator housing connecting the at least one piezoelectric component with the electrical contacts on the second surface of the resonator housing, and a cover integral with the resonator housing sidewalls and defining a hermetic enclosure for the resonator cavity;

the oscillator housing having a base with first and second surfaces, oscillator housing sidewalls unitary with the base of oscillator housing and extending substantially perpendicularly therefrom, forming an open oscillator cavity therewith, the oscillator sidewalls further defining an upper peripheral surface, the oscillator cavity being adapted to receive at least one electronic component including at least one flip chip integrated circuit at the planar substrate first surface, the upper peripheral surface suitable for electrical connection with a circuit board, a plurality of electrical contacts formed at the oscillator housing second surface, a plurality of electrically conductive vias in the oscillator housing connecting the at least one electronic component with the electrical contacts on the second surface of the oscillator housing;

the second surface of the resonator housing coupled with the second surface of the oscillator housing by a plurality of bonding pads connected to the plurality of resonator housing electrical contacts and oscillator housing electrical contacts, and the at least one piezoelectric component and the at least one electronic component being electrically connected to one another.

* * * * *